United States Patent [19]
Hinooka

[11] Patent Number: 5,153,458
[45] Date of Patent: Oct. 6, 1992

[54] CODE SETTING CIRCUIT WITH FUSIBLE THIN FILM RESISTORS

[75] Inventor: Kiyonobu Hinooka, Tokyo, Japan
[73] Assignee: NEC Corporation, Tokyo, Japan
[21] Appl. No.: 727,549
[22] Filed: Jul. 9, 1991
[30] Foreign Application Priority Data
  Jul. 10, 1990 [JP] Japan .................................. 2-182034
[51] Int. Cl.$^5$ .................................................. H03K 19/00
[52] U.S. Cl. .................................. 307/443; 307/202.1; 307/246; 307/296.5
[58] Field of Search ............... 307/202.1, 246, 296.5, 307/443, 465, 468

[56] References Cited
U.S. PATENT DOCUMENTS
4,806,793  2/1989  Golab .............................. 307/443
4,843,262  6/1989  Abe ................................ 307/443 X
4,952,823  8/1990  Guo ................................ 307/449 X Primary Examiner—Robert J. Pascal

[57] ABSTRACT

A trimming code setting circuit formed between a first and a second potential source includes a transistor, an inverter, a capacitor and a fusible resistor. The transistor has its source-drain passage connected between the first potential source and an output node. The inverter is connected between the output node and a gate of the transistor. The capacitor is connected between the first potential source and the output node. The resistor is connected between the output node and the second potential source. A steady-state current does not flow after the resistor is cut and this allows an increase in current capability of the circuit. There is no possibility for the trimming codes to change with lapse of time.

11 Claims, 2 Drawing Sheets

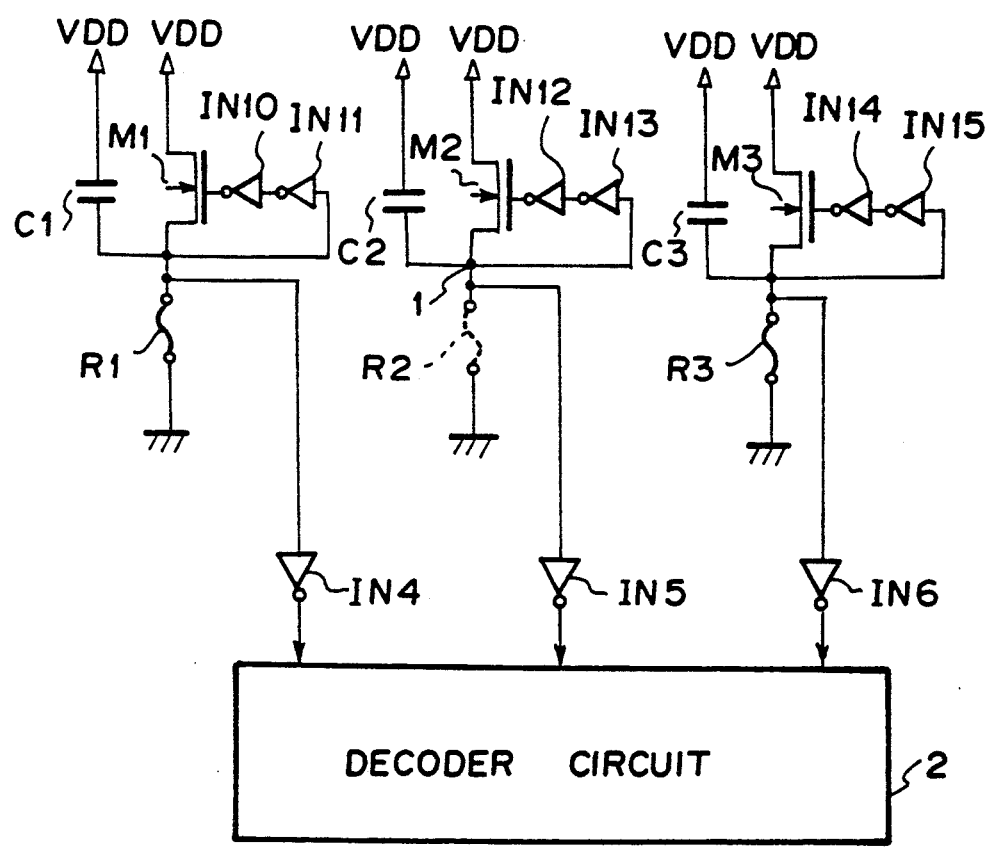
F I G. 3

CODE SETTING CIRCUIT WITH FUSIBLE THIN FILM RESISTORS

BACKGROUND OF THE INVENTION

The present invention relates to a code setting circuit and, more particularly, to a code setting circuit which has a conductive thin film fuse for trimming purposes.

With advancement in higher capability of and higher integration in integrated circuit devices in recent years, there has been a development of stronger desires for a higher accuracy in the setting of circuit conditions and lower power consumption. Especially for the setting of values of reference voltages or circuit currents in analog circuits, it is necessary to provide a circuit for adjusting a current value to a specified value by trimming methods since requirements to catalog specifications have been very strict. The trimming becomes fixed once the setting is effected in the course of a manufacturing process and cannot be readjusted at a later stage of the industrial application of a manufactured product. Such a circuit cannot have any changes in its permanent characteristics and should to be highly reliable without any fear of malfunction.

The conventional circuit for trimming purposes, that is, the trimming code setting circuit has problems in that the set trimming codes undergo changes with lapse of time during the service life of the circuit, and that since a steady-state current flows in the circuit, it is necessary to restrict the current to lower power consumption.

SUMMARY OF THE INVENTION

It is an object of the invention to overcome the problems existing in the conventional circuit and to provide an improved trimming code setting circuit.

It is another object of the invention to provide a trimming code setting circuit which does not undergo changes with lapse of time during the service life of the circuit used.

It is a further object of the invention to provide a trimming code setting circuit which is operable at low power consumption.

According to the present invention, there is provided a code setting circuit formed between a first and a second potential source, the circuit comprises:

a transistor having its source-drain passage connected between the first potential source and an output node;

an inverter connected between the output node and a gate of the transistor;

a capacitor connected between the first potential source and the output node; and a resistor connected between the output node and the second potential source.

BRIEF DESCRIPTION OF THE DRAWINGS

The above and other objects, features and advantages of the present invention will be apparent from the following description of preferred embodiments of the invention explained with reference to the accompanying drawings, in which:

FIG. 3 is a circuit diagram of another embodiment according to the invention.

DESCRIPTION OF PREFERRED EMBODIMENTS OF THE INVENTION

For the purpose of assisting in the understanding of the invention, first a conventional trimming code setting circuit is explained in detail before the present invention is explained.

Figure 1:
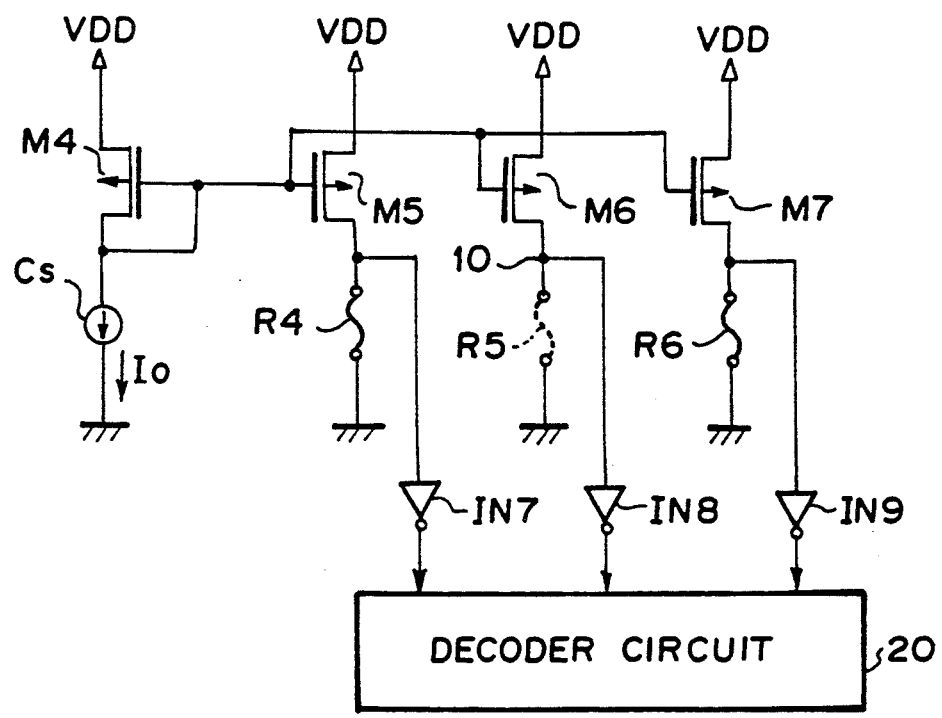
FIG. 1 is a circuit diagram of a conventional trimming code setting circuit.

FIG. 1 schematically shows an example of a conventional code setting circuit wherein three trimming code setting circuits are provided within a range from the highest potential of VDD = +5 V to the lowest potential of GND = 0 V.

The circuit operation is explained for a trimming code setting circuit which is formed by a P-channel MOS transistor M6 whose source-drain passage is connected between the highest potential source VDD and an output node 10 and a thin film resistor R5 connected between the output node 10 and the ground GND. Two other trimming code setting circuits, one formed by a P-channel MOS transistor M5 and a thin film resistor R4 and the other formed by a P-channel MOS transistor M7 and a thin film resistor R6, are of the same circuit configuration and operation as those of the trimming code setting circuit formed by the transistor M6 and the resistor R5.

The P-channel MOS transistor M6 is mirror-connected to a P-channel MOS transistor M4 and has a function to allow the flow of a constant current Io which is determined by the constant current source $C_s$. That is to say that there is formed a ratio circuit by the P-channel MOS transistor M6 together with the thin film resistor R5. When resistor R5 is not cut, since the resistance value of the resistor R5 is smaller than the ON-resistance of the transistor M6, the output node 10 of the ratio circuit, that is, the junction node between the transistor M6 and the resistor R5, is of a value lower than the logical threshold value of an inverter IN8. Thus, the inverter IN8 outputs a high level output to a decoder circuit 20. The decoder circuit decodes a plurality of signals from the outputs of the code setting circuits (each signal is "0" or "1" level) and outputs any predetermined output desired. For example, where one of the decoder output lines outputs "1" based on the outputs from the code setting circuit, a predetermined corresponding transistor is turned "On", whereby a predetermined desired output voltage can be derived from an output terminal.

Now the case will be discussed where the resistor R5 is cut. Here, due to the transistor M6, the output of the ratio circuit becomes higher than the logical threshold value of the inverter IN8. Therefore, the inverter IN8 outputs a low level output. Thus whether the trimming code setting with respect to the decoder circuit 20 is possible or not is decided by whether the thin film resistor R5 is cut or not.

Normally, the cutting of the thin film resistor is effected in the following ways. A pad, for example of aluminum, is taken out from the junction between the thin film resistor and the P-channel MOS transistor, and then a voltage is applied through the pad to the particular thin film resistor to be cut during a wafer inspection step, for example with a tester whereby the thin film resistor is fused and cut by the current flowing therein. Other methods of cutting include one by which the selected thin film resistor is cut thermally by applying a laser beam thereto.

As explained above, the trimming code setting is effected by having the thin film resistor cut to obtain a code setting circuit in which, once the trimming is done, there should be no change at any time during the service life of the semiconductor circuit device utilizing such code setting circuit; this would provide the circuit of high reliability.

It is not possible to effect the complete removal of the thin film resistor which is not completely cut, so that there have been problems when the trimming codes used have undergone changes in time and have become defective.

Conventionally, since the current flows constantly or steadily if the thin film resistor is not cut, it has been necessary to restrict the current allowed to flow by the constant current source due to problems associated with power consumption. For example, if the current which is allowed to flow by the thin film resistor and the P-channel MOS transistor forming the ratio circuit is 10 $\mu$A and the current leaks from the cut portion and which is detected in a test is smaller than 10 $\mu$A, the test is passed. Subsequently, a change may develop as time goes by and, if the leak current would exceed 10 $\mu$A, the output of the inverter will immediately change and the circuit involved would become defective.

Thus, in the conventional trimming code setting circuit, since the tolerance allowed for a possible leakage in an incompletely cut thin field resistor is small, the reliability of the semiconductor integrated device equipped with such trimming code setting circuit has been low.

Figure 2:
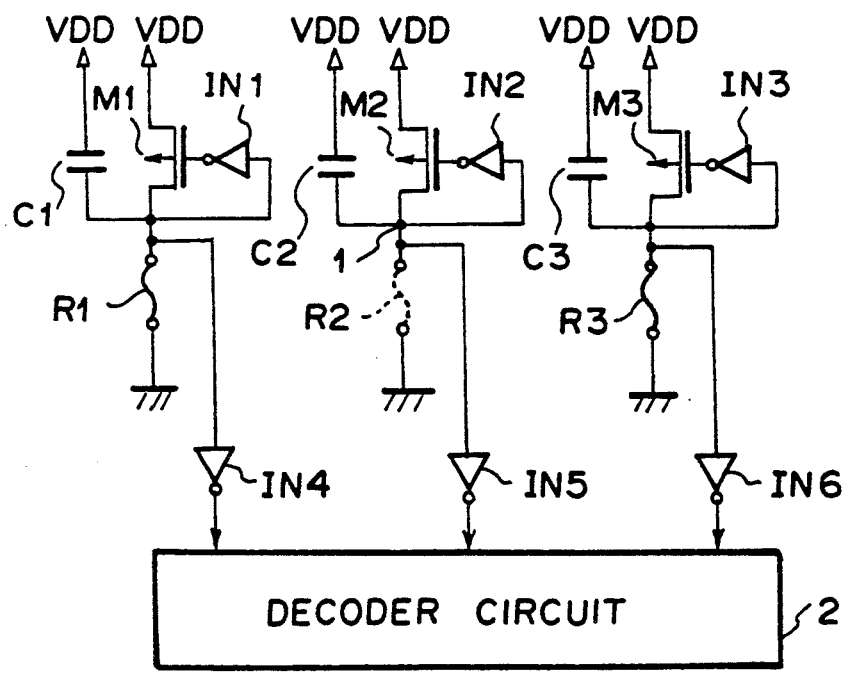
FIG. 2 is a circuit diagram of an embodiment according to the invention.

The present invention will be now explained with reference to the drawings. FIG. 2 is a circuit diagram of an embodiment of the present invention. As in the conventional circuit explained above with reference to FIG. 1, there are provided three trimming code setting circuits formed within a range from the highest potential of VDD = +5 V to the lowest potential of GND = 0 V. Here, a first trimming code setting circuit composed of a P-channel MOS transistor M2, a thin film resistor R2, an inverter IN2 and a capacitor C2 is taken up for explanation. Of the two remaining trimming code setting circuits, one is formed by a P-channel MOS transistor M1, a thin film resistor R1, an inverter IN1 and a capacitor C1 and the other formed by a P-channel MOS transistor M3, a thin film resistor R3, an inverter IN3 and a capacitor C3. Each of the remaining trimming code setting circuits has the same circuit arrangements as those of the circuit formed by the transistor M2, the resistor R2, the inverter IN2 and the capacitor C2. The capacitance of the capacitor C2 is made sufficiently large as compared with other parasitic capacitance which is associated with an output node 1. Also, an ON-resistance of the transistor M2 is made large for the resistance of the resistor R2. The thin film resistor R2 may be a film resistor formed of polycrystalline silicon in the course of the diffusion process of silicon which may formed with aluminum as long as such thin film is fusible.

First, an instance where the resistor R2 remains uncut is considered. Immediately after the power source is turned ON, the potential at the output node 1 is momentarily determined by the division of the capacitance of capacitive components against respective potentials. However, since the capacitor C2 the capacitance of which is sufficiently large with respect to the other parasitic capacitance is positioned between the node 1 and the highest potential source VDD, the potential at the output node 1 rises substantially to the VDD potential. Thus, the inverter IN2 outputs a low level output and the transistor M2 turns ON accordingly. Next, since the resistance of the resistor R2 is smaller than the ON-resistance of the transistor M2, the potential at the output node 1 is caused to be lowered approximately to the ground potential GND. Thus, the inverter IN2 outputs a high level output and the inverter IN5 outputs a high level output to a decoder circuit 2.

At the above point in time, the transistor M2 is turned OFF completely and the potential at the output node 1 turns to the ground potential GND. That is, in the circuit according to this embodiment, even when the resistor R2 is not cut, the circuit current does not flow so that, unlike in a conventional circuit, there is no need to lower the current in consideration of power consumption.

In the case where the resistor R2 is cut, immediately after the power source has been turned ON, the potential at the output node 1 rises substantially to the VDD potential as explained above. Thus, the inverter IN2 outputs a low level output and the transistor M2 turns ON accordingly. Here, since the resistor R2 has been cut, the potential at the node 1 maintains its high level whereby the inverter IN5 continues to output the low level output. Thus, the possibility of trimming code setting depends on whether the thin film resistor R5 is cut or uncut.

In the circuit according to the present invention, as explained above, the steady-state current does not flow irrespective of whether the thin film resistor is cut or uncut so that, unlike a conventional circuit, there is no need to lower the current which flows through the thin film resistor and the P-channel MOS transistor which form the ratio circuit.

Accordingly, the current which will flow in the P-channel MOS transistor can be increased up to in the order of 1 mA whereas, in the conventional circuit, it has been set to in the order of 10 $\mu$A in consideration of power consumption.

Since there may be no case where the leak current flowing in the thin film resistor, which has been cut, becomes larger than 1 mA, there is no fear that the trimming codes would change with lapse of time with the circuit of the present invention.

In the embodiment explained above, the transistor M2 is a P-channel MOS transistor. However, an N-channel MOS transistor can be used with a two-stage inverter circuit (IN12, IN13) provided to its gate, as shown in FIG. 3.

As explained above, according to the present invention, there is no necessity to make the current low to reduce power consumption since a steady-state current does not flow after the resistor is cut and this allows for an increase in currents. Thus, since no leak current of the resistor, after it has been cut has any influence, the trimming codes would not change with time whereby the reliability of a semiconductor integrated circuit device which requires a trimming code setting is markedly enhanced.

While the invention has been described in its preferred embodiments, it is to be understood that the description should not be limited to the preferred embodiments and that changes within the purview of the appended claims may be made without departing from the true scope and spirit of the invention in its broader aspects.

What is claimed is:

1. A code setting circuit interconnected between a first and a second potential source and comprising;

a transistor having its source-drain passage connected between said first potential source and an output node;

an inverter connected between said output node and a gate of said transistor;

a resistor connected between said output node and said second potential source; and a capacitor connected between said first potential source and said output node and operated to block d.c. current through said resistor and thus prevent a flow of a steady-state current in the circuit.

2. A code setting circuit according to claim 1, in which said resistor is a fusible thin film resistor having a resistance value smaller than ON-resistance of said transistor.

3. A code setting circuit according to claim 1, in which said transistor is a P-channel MOS transistor.

4. A code setting circuit according to claim 1, in which capacitance of said capacitor is larger than that of parasitic capacitance associated with said output node.

5. A code setting circuit interconnected between a first and a second potential source and comprising:

a transistor having its source-drain passage connected between said first potential source and an output node;

a two-stage inverter circuit connected between said output node and a gate of said transistor;

a resistor connected between said output node and said second potential source; and a capacitor connected between said first potential source and said output node and operated to block d.c. current through said resistor and thus prevent a flow of a steady-state current in the circuit.

6. A code setting circuit according to claim 5, in which said transistor is an N-channel MOS transistor.

7. A code setting circuit interconnected between a first and a second potential source and comprising:

a transistor having its source-drain passage connected between said first potential source and an output node;

an inverter connected between said output node and a gate of said transistor;

a resistor connected between said output node and said second potential source; and a capacitor connected between said first potential source and said output node, said capacitor having a capacitance which is larger than that of parasitic capacitance associated with said output node to block d.c. current through said resistor and thus prevent a flow of a steady-state current in the circuit.

8. A code setting circuit according to claim 7, in which said transistor is a P-channel MOS transistor.

9. A code setting circuit according to claim 7, in which said resistor is a fusible thin film resistor having a resistance value smaller than ON-resistance of said transistor.

10. A code setting circuit interconnected between a first and a second potential source and comprising:

a transistor having its source-drain passage connected between said first potential source and an output node;

a two-stage inverter circuit connected between said output node and a gate of said transistor; a resistor connected between said output node and said second potential source; and a capacitor connected between said first potential source and said output node, said capacitor having a capacitance which is larger than that of parasitic capacitance associated with said output node to block d.c. current through said resistor and thus prevent a flow of a steady-state current in the circuit.

11. A code setting circuit according to claim 10, in which said transistor is an N-channel MOS transistor.

* * * * *